(12) United States Patent
Suzuki et al.

(10) Patent No.: US 11,399,426 B2
(45) Date of Patent: Jul. 26, 2022

(54) WIRING BOARD AND METHOD FOR MANUFACTURING SAME

(71) Applicant: NGK SPARK PLUG CO., LTD., Nagoya (JP)

(72) Inventors: Toshio Suzuki, Komaki (JP); Masami Kanayama, Komaki (JP); Akiyoshi Hattori, Komaki (JP); Masanori Kito, Iwakura (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 339 days.

(21) Appl. No.: 16/326,275

(22) PCT Filed: Jul. 19, 2017

(86) PCT No.: PCT/JP2017/026056
§ 371 (c)(1),
(2) Date: Feb. 18, 2019

(87) PCT Pub. No.: WO2018/042918
PCT Pub. Date: Mar. 8, 2018

(65) Prior Publication Data
US 2019/0191544 A1 Jun. 20, 2019

(30) Foreign Application Priority Data

Aug. 31, 2016 (JP) .............................. JP2016-169587

(51) Int. Cl.
*B32B 15/01* (2006.01)
*C23C 30/00* (2006.01)
(Continued)

(52) U.S. Cl.
CPC ........... *H05K 1/0218* (2013.01); *B32B 15/01* (2013.01); *B32B 15/013* (2013.01);
(Continued)

(58) Field of Classification Search
CPC ... H05K 2201/0347; H05K 2201/0338; H05K 9/0075; H05K 1/0218; H05K 1/092;
(Continued)

(56) References Cited

U.S. PATENT DOCUMENTS

| 2010/0015468 A1 | 1/2010 | Yamamoto et al. |
| 2013/0186675 A1 | 7/2013 | Takahashi et al. |
| 2015/0187529 A1* | 7/2015 | Blattler ................ H05K 1/0293 337/297 |

FOREIGN PATENT DOCUMENTS

| CN | 103228102 A | 7/2013 |
| JP | H06-6000 A | 1/1994 |

(Continued)

OTHER PUBLICATIONS

Japan Patent Office, Office Action (Notification of Reasons for Refusal) issued in corresponding Application No. 2016-169587, dated Nov. 24, 2020.
(Continued)

*Primary Examiner* — Michael E. La Villa
(74) *Attorney, Agent, or Firm* — Stites & Harbison, PLLC; Jeffrey A. Haeberlin; James R. Hayne

(57) ABSTRACT

A wiring board and a method for manufacturing the wiring board in which an initial Cu plated layer is formed by plating so as to cover the surface of a metallized layer and then the initial Cu plated layer is heated to be softened or melted. Copper in the softened or melted initial Cu plated layer enters into open pore portions of the metallized layer. In addition, during the heating, components of the metallized layer and components of the initial Cu plated layer are mutually thermally diffused. Consequently, when solidified later (that is, when the initial Cu plated layer becomes a lower Cu plated layer), the adhesiveness between the metallized layer and the lower Cu plated layer is improved due
(Continued)

to, for example, an anchoring effect and a mutual thermal diffusion effect.

10 Claims, 5 Drawing Sheets

(51) Int. Cl.

| | |
|---|---|
| H05K 9/00 | (2006.01) |
| H05K 1/02 | (2006.01) |
| H05K 1/09 | (2006.01) |
| H05K 3/46 | (2006.01) |
| H01L 21/48 | (2006.01) |
| H01L 23/498 | (2006.01) |
| H01L 23/13 | (2006.01) |
| H01L 23/552 | (2006.01) |
| H01L 23/12 | (2006.01) |
| H05K 3/24 | (2006.01) |
| H05K 3/12 | (2006.01) |
| B32B 15/04 | (2006.01) |
| C23C 28/02 | (2006.01) |
| B32B 15/20 | (2006.01) |
| H05K 3/26 | (2006.01) |
| H01L 23/367 | (2006.01) |
| H01L 23/00 | (2006.01) |
| H05K 1/18 | (2006.01) |
| H05K 3/18 | (2006.01) |

(52) U.S. Cl.
CPC .......... *B32B 15/015* (2013.01); *B32B 15/017* (2013.01); *B32B 15/018* (2013.01); *B32B 15/04* (2013.01); *B32B 15/043* (2013.01); *B32B 15/20* (2013.01); *C23C 28/02* (2013.01); *C23C 28/021* (2013.01); *C23C 28/023* (2013.01); *C23C 30/00* (2013.01); *C23C 30/005* (2013.01); *H01L 21/4857* (2013.01); *H01L 23/12* (2013.01); *H01L 23/13* (2013.01); *H01L 23/49822* (2013.01); *H01L 23/49866* (2013.01); *H01L 23/552* (2013.01); *H05K 1/0242* (2013.01); *H05K 1/09* (2013.01); *H05K 1/092* (2013.01); *H05K 3/1291* (2013.01); *H05K 3/24* (2013.01); *H05K 3/4644* (2013.01); *H05K 9/0075* (2013.01); *H01L 23/367* (2013.01); *H01L 24/32* (2013.01); *H01L 24/48* (2013.01); *H01L 24/73* (2013.01); *H01L 2224/32225* (2013.01); *H01L 2224/48091* (2013.01); *H01L 2224/48106* (2013.01); *H01L 2224/48227* (2013.01); *H01L 2224/73265* (2013.01); *H05K 1/181* (2013.01); *H05K 3/18* (2013.01); *H05K 3/244* (2013.01); *H05K 3/246* (2013.01); *H05K 3/26* (2013.01); *H05K 2201/0338* (2013.01); *H05K 2201/0347* (2013.01); *Y10T 428/1291* (2015.01); *Y10T 428/12361* (2015.01); *Y10T 428/12375* (2015.01); *Y10T 428/12382* (2015.01); *Y10T 428/12389* (2015.01); *Y10T 428/12396* (2015.01); *Y10T 428/12708* (2015.01); *Y10T 428/12715* (2015.01); *Y10T 428/12722* (2015.01); *Y10T 428/12868* (2015.01); *Y10T 428/12875* (2015.01); *Y10T 428/12882* (2015.01); *Y10T 428/12889* (2015.01); *Y10T 428/12896* (2015.01); *Y10T 428/12903* (2015.01)

(58) Field of Classification Search
CPC ........ H05K 1/0242; H05K 1/09; H05K 1/181; H05K 3/1291; H05K 3/24; H05K 3/4644; H05K 3/246; H05K 3/244; H05K 3/26; H05K 3/18; H01L 23/12; H01L 23/13; H01L 23/49822; H01L 23/49866; H01L 23/552; H01L 23/367; H01L 21/4857; H01L 24/32; H01L 24/48; H01L 24/73; H01L 2224/32225; H01L 2224/48106; H01L 2224/48227; H01L 2224/48091; H01L 2224/73265; H01L 2924/00; H01L 2924/00014; B32B 15/01; B32B 15/013; B32B 15/015; B32B 15/017; B32B 15/018; B32B 15/04; B32B 15/043; B32B 15/20; C23C 30/00; C23C 30/005; C23C 28/02; C23C 28/021; C23C 28/023; Y10T 428/12882; Y10T 428/12889; Y10T 428/12896; Y10T 428/12903; Y10T 428/1291; Y10T 428/12875; Y10T 428/12868; Y10T 428/12708; Y10T 428/12715; Y10T 428/12722; Y10T 428/12361; Y10T 428/12375; Y10T 428/12382; Y10T 428/12389; Y10T 428/12396

See application file for complete search history.

(56) References Cited

FOREIGN PATENT DOCUMENTS

| | | |
|---|---|---|
| JP | H11-102814 A | 4/1999 |
| JP | H11-111891 A | 4/1999 |
| JP | H11-251699 A | 9/1999 |
| JP | 2003-100952 A | 4/2003 |
| JP | 2003-234552 A | 8/2003 |
| JP | 2006-41225 A | 2/2006 |
| JP | 2011-49471 A | 3/2011 |
| JP | 2015-222841 A | 12/2015 |
| WO | 2008/081758 A1 | 7/2008 |

OTHER PUBLICATIONS

Japan Patent Office, International Search Report in International phase of subject application, PCT/JP2017/026056, dated Oct. 3, 2017.
The State Intellectual Property Office of People's Republic of China, Second Office Action issued in corresponding Application No. 201780053451.3 dated Jun. 8, 2021.

\* cited by examiner

WIRING BOARD AND METHOD FOR MANUFACTURING SAME

TECHNICAL FIELD

The present invention relates to a wiring board which is capable of reducing, for example, influence on signals by magnetism, and a method for manufacturing the wiring board.

BACKGROUND TECHNOLOGY

Heretofore, as a wiring board, for example, a ceramic wiring board has been known in which a wiring layer (conductor portion) is formed on a ceramic board. In addition, as this wiring layer, one has been known in which a metallized layer is formed on the ceramic board, a Ni plated layer is formed on the metallized layer by Ni plating and a Cu plated layer or an Au plated layer is formed on the Ni plated layer by Cu-plating or Au plating (see patent documents 1-5).

Here, nickel (Ni) is a ferromagnetic body, and when momentarily exposed to a magnetic field due to use environment or a magnetic component to be mounted, nickel is permanently magnetized, and consequently, electrical characteristics (for example, high frequency characteristics) deteriorate.

As a measure for this, a technique has been known in which, as underlying plating for Au plating, copper (Cu) that is a non-magnetic body is used instead of nickel.

PRIOR ART REFERENCES

Patent Documents

Patent Document 1: Japanese Patent Application Publication H11-251699
Patent Document 2: Japanese patent Application Publication H11-111891
Patent Document 3: Japanese patent Application Publication H11-102814
Patent Document 4: Japanese patent Application Publication H06-6000
Patent Document 5: Japanese patent Application Publication 2011-49471

SUMMARY OF THE INVENTION

Task to be Solved by the Invention

However, as mentioned above, when non-magnetic Cu plating is used instead of Ni plating, due to the insufficient adhesiveness between the metallized layer and the Cu plated layer, failure occurs.

Specifically, when various components are mounted to the wiring layer by solder, problems occur. For example, solder leaching (that is, a phenomenon in which copper is absorbed by solder) occurs, and at the time of wire bonding of, for example, an Au wire, peeling-off of plating occurs. Consequently, mountability becomes insufficient.

That is, when various components are mounted to the wiring layer by solder and the Au wire is bonded (that is, mounted) to the wiring layer by wiring bonding, they cannot be preferably mounted thereon in some case.

The present invention is provided in consideration of the above problems, and an object of the present invention is to provide a wiring board having a conductor portion on which mounting is suitably possible and a method for manufacturing the wiring board.

Means for Solving the Task (1) A first aspect of the present invention relates to a method for manufacturing a wiring board formed with a non-magnetic conductor portion having conductivity.

In a method for manufacturing the wiring board, the method includes a process of forming the conductor portion, the process including; a first operation of forming a non-magnetic conductive layer made of conductive material on a surface of a non-magnetic conductor base portion having conductivity, a part or a whole of the conductor base portion being made of conductive material; a second operation in which the conductive layer is heated to be softened or melted and then is cooled to be solidified; and a third operation of forming a non-magnetic surface layer on a surface of the solidified conductive layer by plating, the surface layer being made of conductive material.

In the present first aspect, since the conducive layer is formed (by, for example, plating) on the surface of the conductor base portion (that is, the exposed surface) and then the conductive layer is heated to be softened and melted (hereinafter, this treatment described as heat treatment), the conductive material of the softened or melted conductive layer enters into open pore portions that are recessed portions of the conductor base portion. In addition, at the time of this heat treatment, components of the conductor base portion and components of the conductive layer are mutually thermally diffused. Consequently, when solidified later, a remarkable effect can be obtained that the adhesiveness between the conductor base portion and the conductive layer is improved due to, for example, an anchoring effect and a mutual thermal diffusion effect, thereby being strongly bonded.

In addition, by the softening or melting, pores (voids) along the surface of the conductor base portion may be formed on the surface of the conductive layer after the heat treatment. However, in the present first aspect, since the surface layer is formed on the surface of the conductive layer by plating, it is possible to cover the open pore portions with the conductive layer and the surface layer sufficiently (that is, cover properties are improved).

Therefore, when various components are mounted on the surface of the conductor portion formed in this way (or mounted on the surface formed by further plating, for example, Au on the surface of the conductor portion) by, for example, solder, or when, for example, an Au wire is bonded thereon by wire bonding (that is, mounting), the mountability is improved.

Moreover, to form the non-magnetic conductor portion, when non-magnetic copper (Cu) is used instead of, for example, ferromagnetic nickel (Ni), for example, there is a problem that the adhesiveness between the conductor base portion formed by metallizing and the conductive layer made of copper is low. However, in the manufacturing method of the present first aspect, since the adhesiveness between the conductor base portion and the conductive layer is improved, there is an advantage that mountability is improved.

That is, in the present first aspect, when the non-magnetic conductor portion is formed, since the adhesiveness between the conductor base portion and the conductive layer is improve, a remarkable effect that the mountability is also improved can be obtained.

In addition, when the heat treatment of the conductive layer is performed, it can be heated at a temperature equal to or higher than 80% of the melting point of the conductive material used for forming the conductive layer.

(2) In a second aspect of the present invention, the conductive layer is formed by using copper or silver, and the surface layer is formed by using copper or silver.

In the present second aspect, as an example, as a material of each of the conductive layer and the surface layer (that is, a material of a non-magnetic body), a preferable material is shown.

(3) A third aspect of the present invention includes a fourth operation of forming a surface plated layer made of at least one of gold, silver and tin on a surface of the surface layer by plating.

In the present third aspect, since the surface plated layer is formed on the surface of the surface layer (that is, the exposed surface) by plating using gold, silver or tin, it is possible to suppress oxidation of the surface layer. Therefore the mounting of various components and the wire bonding can be appropriately performed to the surface plated layer.

In addition, as a material of the surface plated layer, gold (Au) having high oxidation resistance and excellent mountability is preferable.

(4) A fourth aspect of the present invention includes a fifth operation of forming a palladium plated layer made of palladium on the surface of the surface layer by plating, fifth operation which is an operation before the fourth operation.

In the present fourth aspect, since the palladium plated layer is formed on the surface of the surface layer (that is, the exposed surface), in other words, formed between the surface layer and the surface plated layer, the surface plated layer can be thinned by that layer. For example, when gold is used as a material of the surface plated layer, there is an advantage that the usage of expensive gold can be reduced.

(5) In a fifth aspect of the present invention, when the conductor base portion is formed of a material including particles, an open pore portion that is a recessed portion is formed on the surface of the conductor base portion.

In the present fifth aspect, by adjusting, for example, a state of the material of the conductor base portion (for example, a particle diameter in case of powder material) or a manufacturing condition (for example, a heating condition in case of metallization), extremely small unevenness (that is, open pore portions that are recessed portions) can be formed on the surface of the conductor base portion (that is, the exposed surface). For example, by enlarging the particle diameters of the particles, large open pore portions can be formed.

Consequently, when the conductive layer is formed on the conductor base portion, the adhesiveness by an anchoring effect can be improved.

(6) A sixth aspect of the present invention includes a sixth operation of performing treatment for removing a specific kind of a material from the conductor base portion, as an operation before the first operation, when the conductor base portion includes a plurality of kinds of materials.

In the sixth aspect, before forming the conductive layer, the treatment for removing a specific kind of a material of particles (for example, silica) from the conductor base portions is performed by, for example, etching, and thereby it is possible to form the open pore portions on the surface of the conductor base portion, and moreover, it is possible to enlarge the open pore portions.

Consequently, when the conductive layer is formed on the conductor base portion, the adhesiveness by the anchoring effect is further improved.

(7) In a seventh aspect of the present invention, the conductor base portion is formed by metallization.

In the present seventh aspect, as an example, an appropriate forming method for the conductor base portion is shown. For example, as is well known, metallization paste is applied on a green sheet and metallization is performed by baking simultaneously, and the metallized layer can be formed.

(8) An eighth aspect of the present invention relates to a wiring board including a conductor portion that has conductivity and is a non-magnetic body.

In the wiring board, the conductor portion includes: a non-magnetic conductor base portion having conductivity, a part or a whole of the conductor base portion being made of conductive material; a non-magnetic intermediate layer disposed on a surface of the conductor base portion; a non-magnetic conductive layer made of conductive material and disposed on a surface of the intermediate layer; and a non-magnetic surface layer made of conductive material and disposed on a surface of the conductive layer. In addition, the intermediate layer includes a material of the conductor base portion and a material of the conductive layer.

In the present eighth aspect, the conductor portion has a structure in which the conductor base portion, the intermediate layer, the conductive layer and the surface layer are laminated (that is, a structure in which non-magnetic portions are laminated), and the intermediate layer includes the material of the conductor base portion and the material of the conductive layer due to, for example, thermal diffusion. Therefore there is an effect that the adhesiveness between the conductor base portion and the conductive layer having the intermediate layer therebetween is high.

Therefore, when various components are mounted on the surface of the conductor portion (or mounted on the surface formed by further plating gold on the surface of the conductor portion) having such a configuration by solder, or when wire bonding is performed thereon, there is an advantage that the mountability is improved.

Moreover, when non-magnetic copper is used instead of, for example, ferromagnetic nickel to form the conductor portion that is a non-magnetic body, there is a problem that the adhesiveness between the conductor base portion formed by, for example, metallization and the conductive layer made of copper is low. However, in the present eighth aspect, since the adhesiveness between the conductor base portion and the conductive layer can be improved, the mountability can be improved.

That is, in the present eighth aspect, in the conductor portion that is a non-magnetic body, since the adhesiveness between the conductor base portion and the conductive layer is improved, a remarkable effect that the mountability is also improved can be obtained.

(9) In a ninth aspect of the present invention, the conductive layer is made of copper or silver, and the surface layer is made of copper or silver.

In the present ninth aspect, as an example, a preferable material (material of a non-magnetic body) of each of the conductive layer and the surface layer is shown.

(10) In a tenth aspect of the present invention, the surface layer is provided with, on a surface thereof, a surface plated layer made of at least one of gold, silver and tin.

In the present tenth aspect, since the surface plated layer made of at least one of gold, silver and tin is provided on the surface of the surface layer, oxidation of the surface layer can be suppressed. Therefore the mounting of various components and the wire bonding can be preferably performed to the surface plated layer.

(11) In an eleventh aspect of the present invention, a palladium plated layer is provided between the surface layer and the surface plated layer.

In the present eleventh aspect, since the palladium plated layer is provided between the surface layer and the surface plated layer, the surface plated layer can be thinned by that layer.

(12) In a twelfth aspect of the present invention, the conductor base portion includes, on the surface thereof, an open pore portion that is a recessed portion.

By the configuration in the present twelfth aspect, when the conductive layer is formed on the conductor base portion, the adhesiveness by an anchoring effect is improved.

(13) In a thirteenth aspect of the present invention, the conductive material of the conductive layer exists in the open pore portion on the surface of the conductor base portion.

In the present thirteenth aspect, since the conductive material of the conductive layer exists in the open pore portion on the surface of the conductor base portion, when the conductive layer is formed on the conductor base portion, the adhesiveness by an anchoring effect is improved.

(14) In a fourteenth aspect of the present invention, the conductor base portion is a metallized layer.

In the present fourteenth aspect, as an example, a preferable configuration of the conductor base portion is shown.

<In the Following, Each Configuration of the Present Invention Will be Explained>

It is shown that a non-magnetic body is a diamagnetic body of which magnetic susceptibility is less than 0 or a paramagnetic body of which magnetic susceptibility is less than $10 \times 10^{-5}$.

As the conductor portion, a non-magnetic wiring layer can be cited in which a plurality of layers having conductivity are formed on the surface of a metallized layer. That is, it is, for example, a non-magnetic wiring layer formed on the surface of a ceramic board, and an electric wiring for transmitting electric signals (in particular, high speed signals) can be cited. In addition, a non-magnetic laminated body can be cited in which a plurality of layers having conductivity are formed on the surface of a metal plate which is used for a heat sink.

As the conductor base portion, a non-magnetic metallized layer or metal plate can be cited.

As the conductive material used for the conductor base portion, for example, non-magnetic W, Mo, CuW or CuMo can be cited.

As the plating, electrolytic plating or electroless plating can be cited.

The metallization is one in which the surface of ceramic or non-metal material is sintered to be metallized by baking, and the metallized layer formed by the metallization is a metallized layer.

BRIEF DESCRIPTION OF THE DRAWINGS

FIG. 4 (b) is a sectional view showing the open pore portions and the like by cutting the metallized layer after etching treatment, in the thickness direction. FIG. 4 (c) is a sectional view showing a state in which the lower Cu plated layer is laminated on the surface of the metallized layer.

MODE FOR IMPLEMENTING THE INVENTION

Next, an embodiment of a wiring board and a method for manufacturing the wiring board in the present invention will be explained.

1. First Embodiment

In the present first embodiment, as an example, a ceramic wiring board in which a conductor portion that is a wiring layer is formed on a ceramic board and a method for manufacturing the ceramic wiring board will be explained.

[1-1. Configuration of Ceramic Wiring Board]

First, the configuration of the ceramic wiring board in the present first embodiment will be explained.

Figure 1:
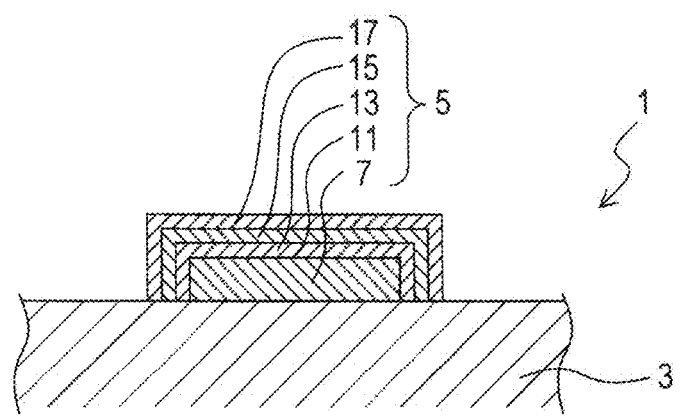
FIG. 1 is a sectional view schematically showing a ceramic wiring board in a first embodiment, which is cut in the thickness direction.

As schematically shown in FIG. 1, an ceramic wiring board 1 of the present first embodiment is a non-magnetic wiring board for mounting various semiconductor elements and crystal, and, for example, it is used as a wiring board of a ceramic package (not shown in the drawings).

The ceramic wiring board 1 is provided with a ceramic board 3 and a conductor portion 5 as a wiring layer provided on the surface of the ceramic board 3.

Among these, the ceramic board 3 is a sintered body made of, for example, alumina (alumina sintered body) that is a non-magnetic body, and the conductor portion 5 is formed of a plurality of the after-mentioned non-magnetic layers having conductivity.

Specifically, the conductor portion 5 is provided with, on the surface of the ceramic board 3, a non-magnetic metallized layer (that is, a conductor base portion) 7. For example, this metallized layer 7 is a sintered body made of tungsten (W) and/or molybdenum (Mo) as a main component and ceramic material, such as alumina ($Al_2O_3$) and silica ($SiO_2$), and it is a layer having well-known conductively.

As this metallized layer 7, for example, one can be cited which contains 92 weight % of tungsten (w), 3 weight % of alumina ($Al_2O_3$) and minute amounts of silica ($SiO_2$), and whose thickness is, for example, about 15 μm. Although silica is contained within a range of 5 weight % or less, in case of, for example, less than 5 weight %, components other than silica are contained, or components of tungsten or alumina are properly adjusted. In addition, the amount of this silica component is not limited to the above-mentioned weight ratio, and the silica component only needs to exist in the metallized layer 7.

Figure 2:
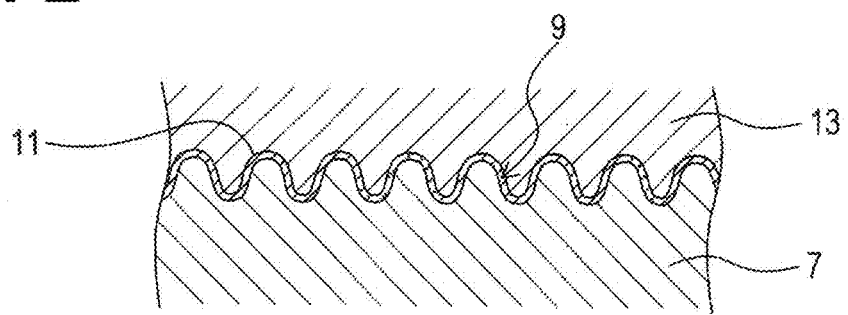
FIG. 2 is a sectional view schematically showing a metallized layer, an intermediate layer and a lower Cu plated layer in the first embodiment which are cut in the thickness direction.
Figure 3A:
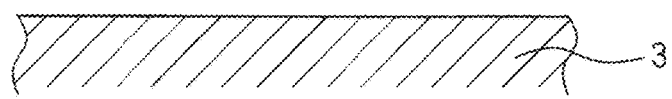
FIG. 3 is an explanatory view showing a manufacturing process for the ceramic wiring board of the first embodiment.
Figure 3B:
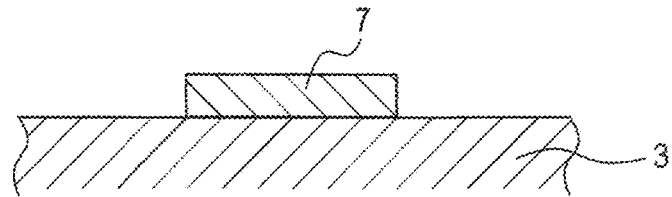
Figure 3C:
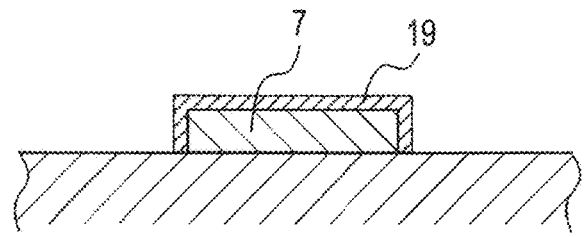
Figure 3D:
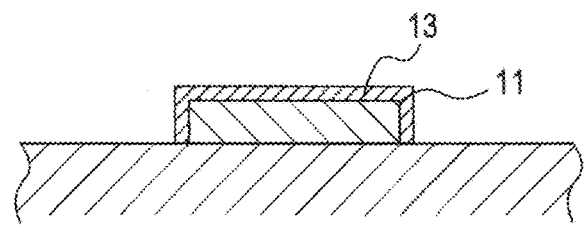
Figure 3E:
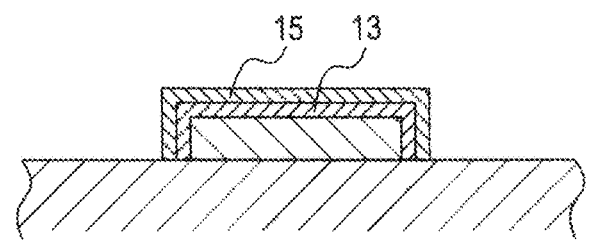
Figure 3F:
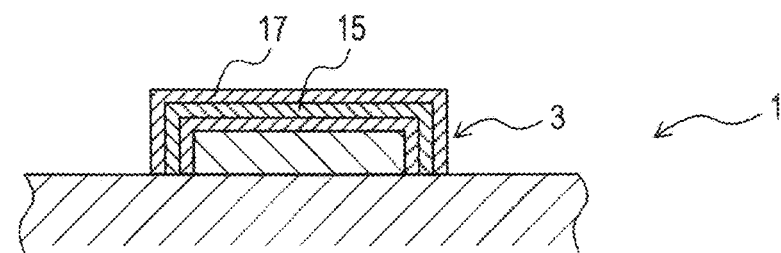

As schematically shown in FIG. 2 so as to be enlarged, particles (for example, crystal particles) such as tungsten and alumina composing the metallized layer 7 are exposed on the surface of the metallized layer 7 (that is, the surface on a side (upper side of FIG. 1) in which the after-mentioned other layers are laminated and which is opposite to a ceramic board 3 side), and a plurality of open pore portions 9 are formed on the surface of the metallized layer 7. In addition, the open pore portions 9 are portions opened outward in the surface, in extremely small cavities existing inside the metallized layer 7 formed by sintering the particles such as tungsten and alumina. That is, the open pore portions 9 are recessed portions of extremely small recessed and projecting portions formed along the surface in which the particles composing the metallized layer 7 are exposed.

Here, by these open pore portions 9, the surface roughness (here, the arithmetic average roughness Ra) of the metallized layer 7 is within a range of, for example, 1.5-2.5 μm.

In addition, an intermediate layer 11 is formed along the surface of the metallized layer 7 (that is, along the surface formed with the open pore portions 9). This intermediate layer 11 is a layer in which the components of layers on the both sides (upper and lower of FIG. 2) in the thickness direction thereof are contained, that is, a layer in which the components of the metallized layer 7 on the lower side of FIG. 2 and the after-mentioned lower Cu plated layer (that is, a conductive layer) 13 on the upper side of FIG. 2 are contained. That is, the intermediate layer 11 is a layer made of, for example, tungsten, ceramic material and copper (Cu).

Returning to FIG. 1, the surface of the intermediate layer 11 (that is, the surface on the laminated side) is formed with the lower Cu plated layer 13 which is made of copper and has a thickness within a range of, for example, 0.5-5 μm (for example, the thickness is 1.5 μm), so as to cover the whole surface of the intermediate layer 11.

This lower Cu plated layer 13 is a layer which is fused to the metallized layer 7 by softening or melting the layer plated with copper by the after-mentioned heat treatment and then solidifying it (that is, a Cu fused layer).

In addition, the surface of the lower Cu plated layer 13 (that is, the surface on the laminated side) is formed with an upper Cu plated layer (that is, a surface layer) 15 which is made of copper and has a thickness within a range of, for example, 2.5-10 μm (for example, the thickness is 5 μm), so as to cover the whole surface of the lower Cu plated layer 13.

Moreover, the surface of the upper Cu plated layer 15 (that is, the surface on the laminated side) is formed with an Au plated layer (that is, a surface plated layer) 17 which is made of gold (Au) and has a thickness within a range of, for example, 0.5-3 μm (for example, the thickness is 1 μm), so as to cover the whole surface of the upper Cu plated layer 15.

Furthermore, the ceramic board 3 is a non-magnetic body, and since each of the layers 7, 11, 13, 15 and 17 forming the conductor portion 5 is a non-magnetic body, the conductor portion 5 is also a non-magnetic body, and the ceramic wiring board 1 is therefore a non-magnetic body.

[1-2. Method for Manufacturing Ceramic Wiring Board]

Next, a method for manufacturing the ceramic wiring board 1 of the present first embodiment will be explained.

(1) In the present first embodiment, first, as shown in FIG. 3 (*a*), the ceramic board 3 composed of a well-known alumina sintered body is prepared, and as shown in FIG. 3 (*b*), the metallized layer 7 is formed on the surface of the ceramic board 3.

As a method for forming this metallized layer 7, first, well-known metallized paste is prepared by adding predetermined vehicle and the like to a solid component composed of conductive material consisting of at least one of tungsten and molybdenum (for example, tungsten) and of ceramic material composed of alumina and silica.

In addition, as a ratio of the solid component, the same ratio as the conventional ratio can be adopted so as to become the composition of the above-mentioned metallized layer 7. Next, the metallized paste is applied to the surface of the ceramic board 3. After that, by baking it, for example, at a temperature of 1500° C., the metallized layer 7 is formed.

Figure 4A:
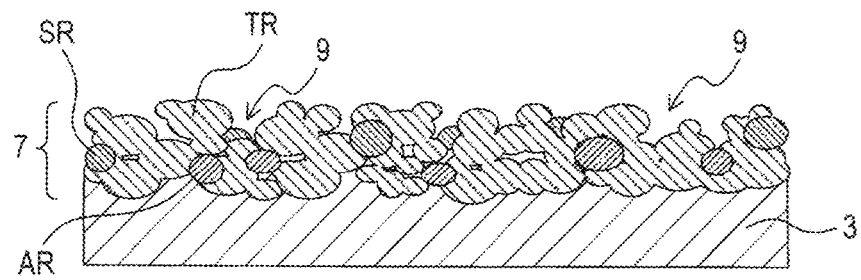
FIG. 4 (a) is a sectional view schematically showing open pore portions and the like by cutting the metallized layer in the thickness direction.
Figure 4B:
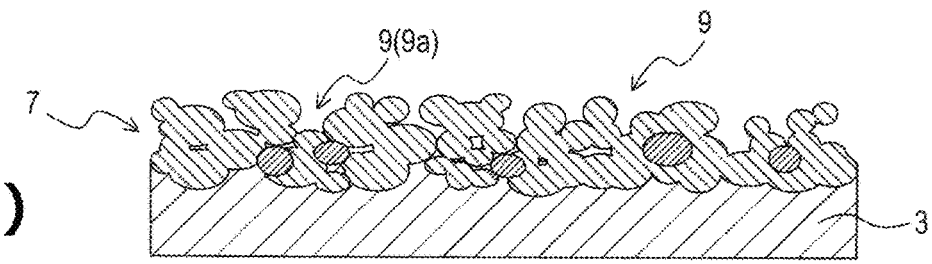
Figure 4C:
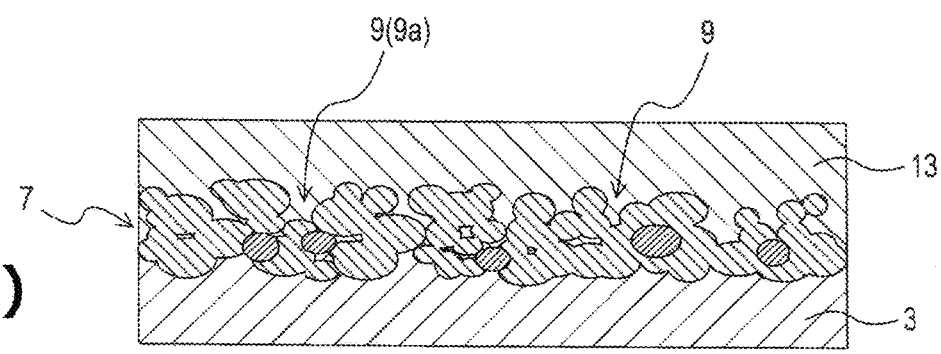

As schematically shown in FIG. 4 (*a*), the metallized layer 7 is composed of various kinds of particles (for example, crystal particles) and the like composing the metallized layer 7. Specifically, the metallized layer 7 is mainly composed of tungsten particles (TR), alumina particles (AR) and silica particles (SR). In addition, each of the particles exists in a state of a single body or an aggregate by being aggregated, and is exposed on the surface of the metallized layer 7 in that state.

Consequently, the open pore portions 9 along the shape of the particle single-body or the aggregate of the particles are formed on the surface of the metallized layer 7. In addition, in this stage, the inner diameter of each of the open pore portions 9 is equal to 1 μm or greater.

Next, as plating pretreatment, washing is performed to the surface of the metallized layer 7. The silica particles (SR) as a glass component are exposed on a part of the surface of the metallized layer 7, and by the washing, they are removed. As the plating pretreatment, for example, the silica particles (SR) may be removed by etching using hydrofluoric acid.

Consequently, as shown in FIG. 4 (*b*), the open pore portions 9 on the surface of the metallized layer 7 become open pore portions 9 that are largely recessed portions where the silica particles (SR) have been removed. That is, by removing the silica particles (SR), large open pore portions 9 each having the maximum inner diameter of approximately 3 μm can be formed. By the plating pretreatment, the silica particles (SR) are removed from the surface of the metallized layer 7, and new open pore portions 9 may be formed.

Figure 5:
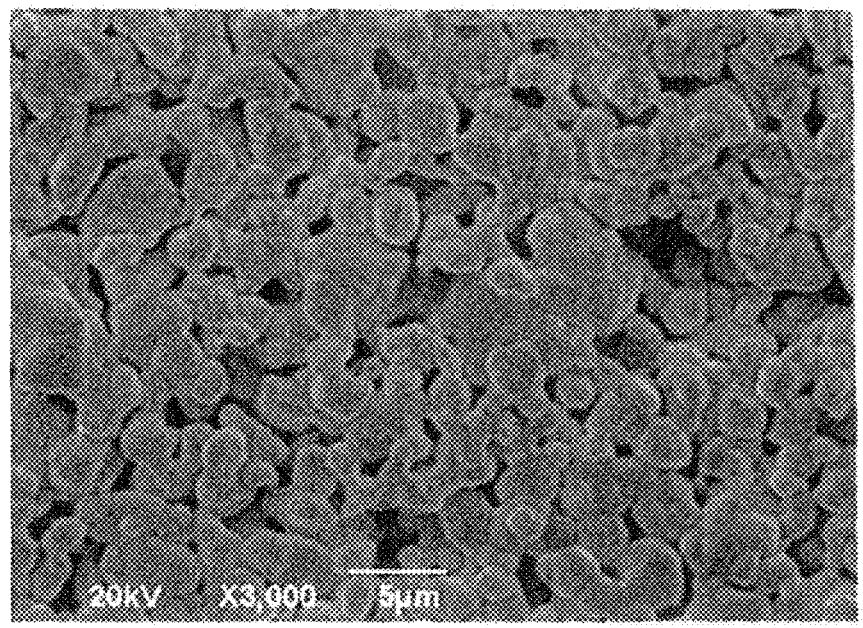
FIG. 5 is a SEM picture showing the open pore portions on the surface of the metallized layer.

In addition, in FIG. 4 (*b*), in the open pore portions 9, one whose inner diameter becomes large by removing the silica particles (SR) is shown by a reference sign "9a". In addition, the surface of the metallized layer 7 before the etching is photographed by using a scanning electron microscope (SEM) at a magnification of ×3000. As shown in FIG. 5 showing the SEM photograph, it can be understood that there are a plurality of pores (voids), that is, a plurality of the open pore portions 9 are formed on the surface of the metallized layer 7.

(2) Next, as shown in FIG. 3 (*c*), an initial Cu plated layer 19 which becomes the lower Cu plated layer (that is, the Cu fused layer) 13 by performing the heat treatment later is formed on the surface of the metallized layer 7.

Specifically, for example, by well-known electrolytic plating or electroless plating (that is, Cu plating), the initial Cu plated layer 19 with a thickness of, for example, 1.5 μm is formed on the surface of the metallized layer 7.

(3) Next, as shown in FIG. 3 (*d*), after the initial Cu plated layer 19 is heated to be softened or melted (that is, after the heat treatment), it is cooled to be solidified, and the lower Cu plated layer 13 is formed.

Specifically, the initial Cu plated layer 19 is heated to a high temperature (for example, 900° C.) equal to or greater than a temperature at which copper is softened or melted to soften or melt the initial Cu plated layer 19 (that is, the heat treatment is performed). With this, as shown in FIG. 4 (c), the softened or melted copper enters (penetrates) into the open pore portions 9 on the surface of the metallized layer 7.

After that, the initial Cu plated layer 19 is cooled to room temperature to be solidified, and then becoming the lower Cu plated layer 13.

In addition, although the softened or melted initial Cu plated layer 19 enters into the open pore portions 9, in open pore portions 9 each having a diameter larger than the thickness of the initial Cu plated layer 19 (for example, 1.5 µm), there is possibility that copper is not sufficiently filled, and recessed portions due to the open pore portions 9 remain on the surface of the lower Cu plated layer 13.

In addition, by the above-mentioned heat treatment, the intermediate layer 11 (see FIG. 2, FIG. 3 (d)) is formed at the interface between the metallized layer 7 and the lower Cu plated layer 13 by mutually diffusing the components of each of the metallized layer 7 and the lower Cu plated layer 13.

(4) Next, as shown in FIG. 3 (e), the upper Cu plated layer 15 is formed on the surface of the lower Cu plated layer 13.

Specifically, for example, by well-known electrolytic plating or electroless plating (that is, Cu plating), the upper Cu plated layer 15 with a thickness of, for example, 5 µm is formed on the surface of the lower Cu plated layer 13.

In addition, when the lower Cu plated layer 13 is formed by solidifying the initial Cu plated layer 19 after being softened or melted, although recessed portions (not shown in the drawings) such as pores (voids) along the surface of the metallized layer 7 may be formed on the surface of the lower Cu plated layer 13, these recessed portions are filled with copper at the time of the formation of the upper Cu plated layer 15, and consequently, the surface of the upper Cu plated layer 15 becomes smooth.

(5) Next, as shown in FIG. 3 (f), the Au plated layer 17 is formed on the surface of the upper Cu plated layer 15.

Specifically, for example, by well-known electrolytic plating or electroless plating (that is, Au plating), the Au plated layer 17 with a thickness of, for example, 1 µm is formed on the surface of the upper Cu plated layer 15.

In this way, the ceramic wiring board 1 is manufactured.

[1-3. Evaluation]

Here, as evaluation, solderability evaluation and wire bondability evaluation will be explained.

<Solderability Evaluation>

As Examples 1 and 2 within the scope of the present invention, samples, each of which was formed with the conductor portion 5 on the ceramic board 3, were prepared similar to the above-mentioned embodiment. In addition, in each of these samples, the initial Cu plated layer 19 with a thickness of 5 µm is formed on the metallized layer 7, the upper Cu plated layer 15 with a thickness of 5 µm is formed on the lower Cu plated layer 13 formed by performing the heat treatment of the present invention, and the Au plated layer 17 with a thickness of 1 µm is formed on that upper Cu plated layer 15.

Figure 6:
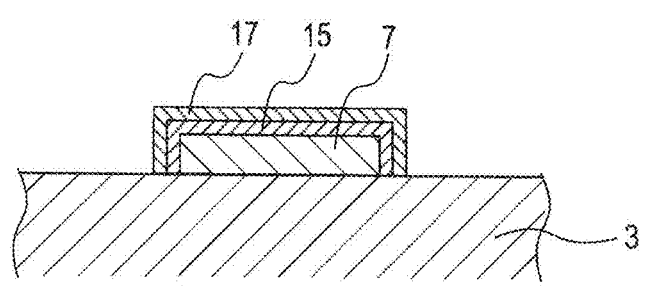
FIG. 6 is a sectional view schematically showing a ceramic wiring board in a comparative embodiment, which is cut in the thickness direction.

In addition, aside from these, as Comparative Examples 1 and 2 outside the scope of the present invention, samples were prepared. In each of the samples, as shown in FIG. 6, the upper Cu plated layer 15 with a thickness of 5 µm is formed on the metallized layer 7 (without performing the heat treatment of the present invention) and the Au plated layer 17 with a thickness of 1 µm is formed on the upper Cu plated layer 15.

After that, flux was applied to the conductor portion 5 of each of the samples, and each of the samples was clipped in a Pb-free solder (SAC305) tank for 5 seconds at 235° C., following which a state of solder (that is, solderability) such as solder wettability was observed.

Here, when the solderability was evaluated, both of a solderability of each of the samples at room temperature (25° C.) (room temperature in Table 1) and a solderability of each of the samples after being heated for 2 minutes at 350° C. (intermediate temperature in Table 1) were observed. In addition, the reason why each of the samples was heated at 350° C. is that a temperature condition to be actually used is considered.

The result is shown in the following Table 1. In addition, "OK" in Table 1 indicates a desirable state in which solder is wetted and spread over the entire surface of the conductor portion 5 and thereby failure such as solder non-wetting and solder leaching does not occur. On the other hand, "NG" in Table 1 indicates an undesirable state in which the solder leaching occurs.

TABLE 1

|  | Solderability |
| --- | --- |
| Example 1 (room temperature) | OK |
| Example 2 (intermediate temperature) | OK |
| Comparative Example 1 (room temperature) | NG |
| Comparative Example 2 (intermediate temperature) | NG |

As is clear from this Table 1, Examples 1 and 2 within the scope of the present invention are preferable because they are superior in the solderability. In contrast to these, Comparative Examples 1 and 2 of the present invention are not preferable because they are poor in the solderability.

<Wire Bondability Evaluation>

As Examples 3 and 4 within the scope of the present invention, samples, each of which was formed with the conductor portion 5 on the ceramic board 3, were prepared similar to Examples 1 and 2.

In addition, samples of Comparative Examples 3 and 4 outside the scope of the present invention were prepared to be the same as those of Comparative Examples 1 and 2.

Then, an Au wire with a diameter of 30 µm was bonded to the conductor portion 5 of each of the samples. After that, the ceramic board 3 was fixed and a tensile test (MIL-STD-883) in which the Au wire was pulled by applying a load thereto was carried out, and then a state of destruction was examined (that is, the wire bondability was examined).

In addition, in case where the wire bondability was evaluated, similar to the evaluation of the solderability, both of a wire bondability of each of the samples at room temperature (25° C.) (room temperature in Table 2) and a bondability of each of the samples after being heated for 2 minutes at 350° C. (intermediate temperature in Table 2) were observed.

The result is shown in the following Table 2. In addition, "OK" in Table 2 indicates a desirable state in which failure such as plating peeling at the time of the pulling of the Au wire does not occur and the cut of the wire is wire neck cut. On the other hand, "NG" in Table 2 indicates an undesirable state in which plating peeling occurs.

TABLE 2

| | Wire bondability |
|---|---|
| Example 3 (room temperature) | OK |
| Example 4 (intermediate temperature) | OK |
| Comparative Example 3 (room temperature) | NG |
| Comparative Example 4 (intermediate temperature) | NG |

As is clear from this Table 2, Examples 3 and 4 within the scope of the present invention are preferable because they are superior in the wire bondability. In contrast to these, Comparative Examples 3 and 4 of the present invention are not preferable because they are poor in the wire bondability.

[1-4. Effect]

Next, effects of the present first embodiment will be explained.

In the present first embodiment, since the initial Cu plated layer 19 is formed by plating so as to cover the surface of the metallized layer 7 and then the Cu plated layer 19 is heated to be softened or melted, the copper of the softened or melted initial Cu plated layer 19 enters into the open pore portions 9 of the metallized layer 7. In addition, during the heating, components of the metallized layer 7 and components of the initial Cu plated layer 19 are mutually thermally diffused.

Consequently, when solidified later (that is, when the initial Cu plated layer 19 becomes the lower Cu plated layer 13), due to, for example, an anchoring effect and a mutual thermal diffusion effect, a remarkable effect can be obtained that the adhesiveness between the metallized layer 7 and the lower Cu plated layer 13 is improved and thereby they are strongly joined.

In addition, at the time of the softening or melting, pores (voids) along the surface of the metallized layer 7 may be formed on the surface of the lower Cu plated layer 13 after the heat treatment. However, in the present first embodiment, since the upper Cu plated layer 15 is formed by plating so as to cover the surface of the lower Cu plated layer 13, covering properties are improved. Moreover, the Au plated layer 17 is formed so as to cover the surface of the upper Cu plated layer 15.

Consequently, in case where by, for example, solder, various components are mounted on the surface of the conductor portion 5 formed in this way, or in case where by wire bonding, an Au wire is bonded (that is, mounted) on the surface thereof, there is an advantage that mounting properties are improved.

Moreover, to form the conductor portion 5 that is a non-magnetic body, in case where, for example, non-magnetic copper is used instead of ferromagnetic nickel, for example, there is a problem that the adhesiveness between the metallized layer 7 and the initial Cu plated layer 19 is low. However, in the present first embodiment, since the adhesiveness between the metallized layer 7 and the lower Cu plated layer 13 (after the heat treatment of the initial Cu plated layer 19) is improved, mounting properties are also improved.

That is, in the present first embodiment, in case where the conductor portion 5 that is a non-magnetic body is formed, since the adhesiveness between the metallized layer 7 and the lower Cu plated layer 13 is high, a remarkable effect that mounting properties are also high can be obtained.

In addition, in the present first embodiment, since, before forming the initial Cu plated layer 19, by, for example, etching, the treatment for removing particles such as silica is performed in the open pore portions 9 on the surface of the metallized layer 7, the open pore portions 9 can be enlarged (specifically, see the open pore portions 9a whose inner diameters become large in FIG. 4 (b)). Moreover, by removing particles such as silica, open pore portions 9 can be newly formed.

Consequently, in case where the lower Cu plated layer 13 is formed on the metallized layer 7, the adhesiveness can be improved by an anchoring effect.

[1-5. Correspondence Relation with the Scope of Claims]

Here, the correspondence relation of the wording between the present first embodiment and the scope of claims will be explained.

The conductor portion 5, the ceramic wiring board 1, the metallized layer 7, the lower Cu plated layer 13, the upper Cu plated layer 15, the Au plated layer 17, the open pore portions 9 and the intermediate layer 11 in the present first embodiment are respectively correspond to an example of each of a conductor portion, a wiring board, a conductor base portion, a conductive layer, a surface layer, a surface plated layer, open pore portions and an intermediate layer in the present invention.

2. Second Embodiment

Next, although a second embodiment will be explained, the explanation of the same contents as the first embodiment will be omitted.

In addition, the same configuration as the first embodiment will be explained with the same number.

Figure 7:
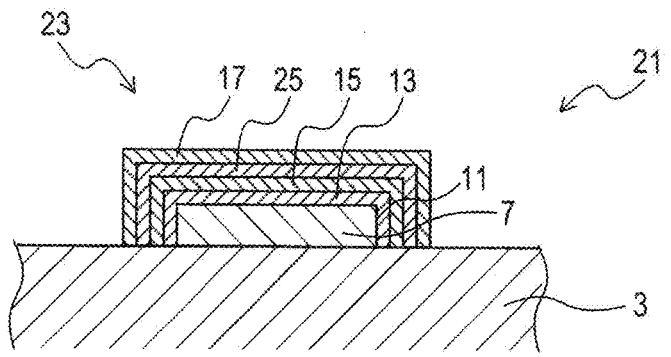
FIG. 7 is a sectional view schematically showing a ceramic wiring board in a second embodiment, which is cut in the thickness direction.

As shown in FIG. 7, in the same way as the first embodiment, a ceramic wiring board 21 of the present second embodiment is one in which a conductor portion 23 that is a wiring layer is formed on the surface of a ceramic board 3.

In this wring board, in the same way as the first embodiment, a lower Cu plated layer 13 is formed on the surface of the metallized layer 7 through an intermediate layer 11, and an upper Cu plated layer 15 is formed on the surface of the lower Cu plated layer 13.

In particular, in the present second embodiment, a Pd plated layer 25 made of palladium (Pd) is formed on the surface of the upper Cu plated layer 15, and an Au plated layer 17 is formed on the surface of the Pd plated layer 25.

This Pd plated layer 25 is formed of electrolytic plating or electroless plating, and its thickness is, for example, 0.01-0.5 μm. In addition, if the thickness of the Pd plated layer 25 exceeds 0.5 μm, there is possibility that solder connectivity deteriorates. It is therefore preferable that the thickness is 0.5 μm or less.

In the present second embodiment, the same effect as the first embodiment can be obtained, and since the Pd plated layer 25 is formed as a base of the Au plated layer 17, there is an advantage that the usage of expensive gold can be reduced.

3. Third Embodiment

Next, although a third embodiment will be explained, the explanation of the same contents as the first embodiment will be omitted.

In addition, the same configuration as the first embodiment will be explained with the same number.

Figure 8:
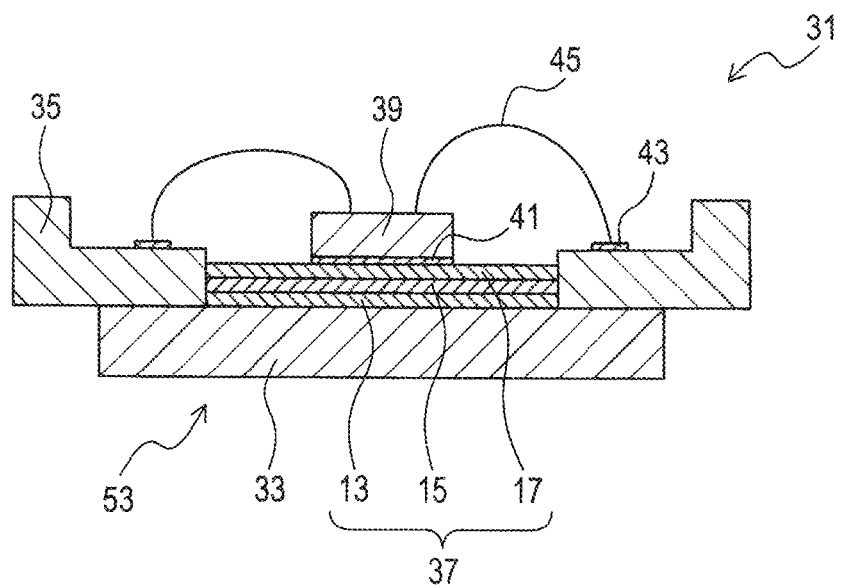
FIG. 8 is a sectional view schematically showing a wiring board and the like in a third embodiment, which are cut in the thickness direction.

As shown in FIG. 8, a non-magnetic wiring board 31 in the present third embodiment is one in which a non-magnetic ceramic member 35 having a frame shape and made of alumina, and the like are joined on a non-magnetic metal plate 33 as a heat sink that is made of, for example, alloy (CuW) of copper and tungsten or alloy (CuMo) of copper and molybdenum.

A non-magnetic coating layer 37 is formed on the surface of the metal plate 33. In the same way as the first embodiment, this coating layer 37 is equipped with, from a metal plate 33 side, a lower Cu plated layer 13 (formed by heat treatment of an initial plated layer 19), an upper Cu plated layer 15 and an Au plated layer 17.

In addition, a conductor portion 53 is formed of the metal plate (that is, a conductor base portion) 33 and the coating layer 37.

Moreover, for example, an electronic component 39 such as IC and the like is bonded on the surface of the coating layer 37 by die bonding with an adhesive layer 41.

In addition, the ceramic member 35 is provided with an electrode 43, and it is electrically connected to the electronic component by an Au wire 45.

In the present third embodiment, the same effect as the first embodiment can be obtained.

4. Another Embodiment

The present invention is not limited to the above embodiments, and it is needless to say that the present invention can be implemented in various aspects within the scope of the present invention.

Figure 9A:
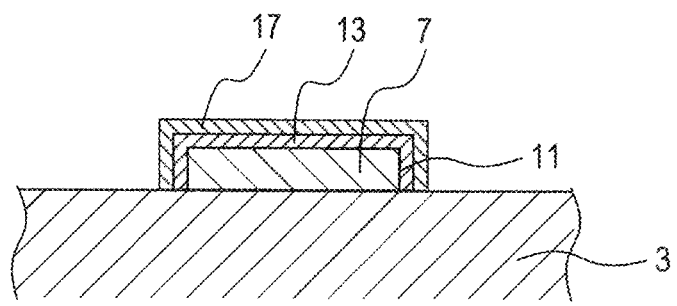
FIG. 9 is a sectional view schematically showing a wiring board and the like in another embodiment, which are cut in the thickness direction.
Figure 9B:
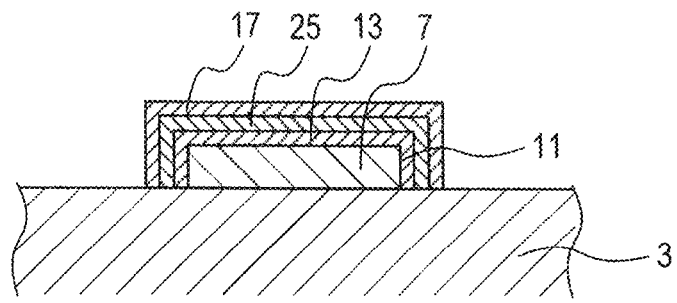

(1) For example, as shown in FIG. 9 (a), a lower Cu plated layer 13 is formed on the surface of a metallized layer 7 on a ceramic board 3 through an intermediate layer 11, and an Au plated layer 17 can be formed on the surface of the lower Cu plated layer 13.

(2) In addition, as shown in FIG. 9 (b), the lower Cu plated layer 13 is formed on the surface of the metallized layer 7 on the ceramic board 3 through the intermediate layer 11, a Pd plated layer 25 is formed on the surface of the lower Cu plated layer 13, and the Au plated layer 17 is formed on the surface of the Pd plated layer 25.

(3) Moreover, a lower Ag plated layer using silver (Ag) can be adopted instead of the lower Cu plated layer (conductive layer). In addition, an upper Ag plated layer using silver (Ag) can be adopted instead of the upper Cu plated layer (surface layer). Furthermore, an Ag plated layer using silver or a Sn plated layer using tin (Sn) can be adopted instead of the Au plated layer (surface plated layer).

(4) In addition, in the above-mentioned embodiments, as an example, although each of the layers is formed by electrolytic plating or electroless plating, each of the layers may be formed by another method (a method for forming a thin film) such as sputtering and vapor deposition.

(5) The configurations of the embodiments can be appropriately combined.

EXPLANATION OF REFERENCE SINGS

1: Ceramic wiring board
3: Ceramic board
5, 53: Conductor portion
7: Metallized layer
9: Open pore portion
11: Intermediate layer
13: Lower Cu plated layer
15: Upper Cu plated layer
17: Au plated layer
25: Pd plated layer
33: Metal plate
37: Coating layer

The invention claimed is:

1. A method for manufacturing a wiring board formed with a non-magnetic conductor portion having conductivity, the method comprising a process of forming the conductor portion, the process comprising:

an operation of forming, on a non-magnetic conductor base portion containing a plurality of silica particles and at least partially being made of conductive material, an open pore portion that is a recessed portion on a surface of the conductor base portion by removing at least some of the plurality of silica particles from the surface of the conductor base portion;

an operation of forming a non-magnetic conductive layer made of conductive material on the surface of the conductor base portion;

an operation in which the conductive layer is heated to be melted to fill the open pore portion and then is cooled to be solidified; and an operation of forming a non-magnetic surface layer on a surface of the solidified conductive layer by plating, the surface layer being made of conductive material.

2. The method for manufacturing the wiring board according to claim 1, wherein the conductive layer is formed by using copper or silver, and the surface layer is formed by using copper or silver.

3. The method for manufacturing the wiring board according to claim 2, comprising an operation of forming a surface plated layer made of at least one of gold, silver and tin on a surface of the surface layer by plating.

4. The method for manufacturing the wiring board according to claim 2, comprising:

forming a palladium plated layer made of palladium on a surface of the surface layer by plating; and forming a surface plated layer made of at least one of gold, silver and tin on a surface of the palladium plated layer by plating.

5. The method for manufacturing the wiring board according to claim 1, wherein the conductor base portion is formed by metallization.

6. A wiring board comprising:

a non-magnetic conductor portion having conductivity, wherein the conductor portion comprises:

a non-magnetic conductor base portion having conductivity, at least a part of the conductor base portion being made of conductive material;

a non-magnetic intermediate layer disposed on a surface of the conductor base portion;

a non-magnetic conductive layer made of conductive material and disposed on a surface of the intermediate layer; and a non-magnetic surface layer made of conductive material and disposed on a surface of the conductive layer, wherein the intermediate layer is a diffusion of a component of the conductor base portion and a component of the conductive layer, wherein the surface layer is provided with, on a surface thereof, a surface plated layer made of at least one of gold, silver and tin, wherein the conductor base portion contains a plurality of silica particles, and wherein the conductor base portion includes, on the surface thereof, a recessed portion formed by removing at least some of the plurality of silica particles from the surface of the conductor base portion.

7. The wiring board according to claim 6, wherein the conductive layer is made of copper or silver, and the surface layer is made of copper or silver.

8. The wiring board according to claim 6,
wherein at least a part of the conductive material of the conductive layer exists in the recessed portion on the surface of the conductor base portion.

9. The wiring board according to claim 6, wherein the conductor base portion is a metallized layer.

10. A wiring board comprising:
a non-magnetic conductor portion having conductivity,
wherein the conductor portion comprises:
 a non-magnetic conductor base portion having conductivity, at least a part of the conductor base portion being made of conductive material;
 a non-magnetic intermediate layer disposed on a surface of the conductor base portion;
 a non-magnetic conductive layer made of conductive material and disposed on a surface of the intermediate layer; and
 a non-magnetic surface layer made of conductive material and disposed on a surface of the conductive layer,
wherein the intermediate layer is a diffusion of a component of the conductor base portion and a component of the conductive layer,
wherein the surface layer is provided with, on a surface thereof, a palladium plated layer,
wherein the palladium plated layer is provided with, on a surface thereof, a surface plated layer made of at least one of gold, silver and tin,
wherein the conductor base portion contains a plurality of silica particles, and
wherein the conductor base portion includes, on the surface thereof, a recessed portion formed by removing at least some of the plurality of silica particles from the surface of the conductor base portion.

* * * * *